United States Patent
Truxel et al.

(10) Patent No.: US 12,092,399 B2
(45) Date of Patent: Sep. 17, 2024

(54) CHIMNEY COOLER DESIGN FOR RUGGED MAXIMUM FREE CONVECTION HEAT TRANSFER WITH MINIMUM FOOTPRINT

(71) Applicant: Raytheon Company, Waltham, MA (US)

(72) Inventors: Andrew Truxel, Hermosa Beach, CA (US); David A. Vasquez, Gardena, CA (US); Jarrett M. Perry, Manhattan Beach, CA (US); Mark V. Tu, Anaheim, CA (US); Emma M. Overly, Long Beach, CA (US)

(73) Assignee: Raytheon Company, Tewksbury, MA (US)

( * ) Notice: Subject to any disclaimer, the term of this patent is extended or adjusted under 35 U.S.C. 154(b) by 553 days.

(21) Appl. No.: 16/947,001

(22) Filed: Jul. 14, 2020

(65) Prior Publication Data
US 2022/0018607 A1    Jan. 20, 2022

(51) Int. Cl.
*F28D 15/02* (2006.01)
*F28D 1/047* (2006.01)
(Continued)

(52) U.S. Cl.
CPC ....... *F28D 15/0233* (2013.01); *F28D 1/0478* (2013.01); *F28F 3/04* (2013.01); *H05K 7/20009* (2013.01); *H05K 7/20445* (2013.01)

(58) Field of Classification Search
CPC .... F28D 15/0233; F28D 1/0478; F28D 1/047; F28D 1/0471; F28D 1/0472;
(Continued)

(56) References Cited

U.S. PATENT DOCUMENTS 5,375,655 A * 12/1994 Lee ........................... F28F 3/02
                                                              165/185
5,947,592 A *  9/1999 Barlow ................... F21V 29/83
                                                              362/345

(Continued)

FOREIGN PATENT DOCUMENTS

| EP | 1551212 A1 | 7/2005 | |
| EP | 2921763 A1 | 9/2015 | |
| WO | WO-2014173419 A1 * | 10/2014 | ............ B22F 3/1055 |

OTHER PUBLICATIONS

International Search Report and Written Opinion of the International Searching Authority dated Sep. 3, 2021 in connection with International Patent Application No. PCT/US2021/033348, 16 pages.

*Primary Examiner* — Len Tran
*Assistant Examiner* — Gustavo A Hincapie Serna

(57) ABSTRACT

An apparatus includes a chimney cooler having a housing. The housing includes a base and sidewalls. The base is configured to support one or more heat-generating components. The sidewalls extend from the base, and each sidewall includes multiple channels. Each channel defines a serpentine flow path configured to receive a fluid coolant. The sidewalls may be lofted away from the heat-generating component(s) as the sidewalls extend from the base. An inlet for each channel may be contoured to promote inertial flow of the fluid coolant into the serpentine flow path. An outlet for each channel may be contoured to promote inertial flow of the fluid coolant exiting the serpentine flow path. Channels at and adjacent to primary objective surfaces of the housing may share a common inlet. The channels at the primary objective surfaces of the housing may have larger outlets relative to the channels adjacent to the primary objective surfaces of the housing.

20 Claims, 7 Drawing Sheets

(51) Int. Cl.
*F28F 3/04* (2006.01)
*H05K 7/20* (2006.01)

(58) Field of Classification Search
CPC ........ F28D 1/0473; F28D 1/0477; F28F 3/04; F28F 3/02; H05K 7/20009; H05K 7/20445; H05K 7/20127; H01L 23/367; H01L 23/467; H01L 23/3672; H01L 23/3675
USPC .......................................................... 165/80.2
See application file for complete search history.

(56) References Cited

U.S. PATENT DOCUMENTS

| | | | |
|---|---|---|---|
| 6,535,603 B2 | 3/2003 | Laetsch | |
| 6,666,260 B2 | 12/2003 | Tantoush | |
| 6,789,610 B1* | 9/2004 | Hegde | H01L 23/467 |
| | | | 165/80.4 |
| 7,099,153 B2 | 8/2006 | Yazawa | |
| 7,144,135 B2* | 12/2006 | Martin | F21S 6/003 |
| | | | 362/345 |
| 7,682,054 B2* | 3/2010 | Hsu | F21V 29/60 |
| | | | 362/373 |
| 8,240,885 B2* | 8/2012 | Miller | F21S 8/038 |
| | | | 362/373 |
| 8,616,714 B2* | 12/2013 | Lee | F21V 3/02 |
| | | | 362/373 |
| 9,069,535 B2* | 6/2015 | Degner | G08B 5/36 |
| 9,335,101 B2* | 5/2016 | Achammer | F21V 29/713 |
| 9,341,362 B2* | 5/2016 | Holmes | F21V 29/717 |
| 9,476,580 B2* | 10/2016 | Treurniet | F21V 29/83 |
| 9,500,356 B2* | 11/2016 | Yang | F21V 29/673 |
| 9,915,420 B2* | 3/2018 | Woytowitz | F21V 29/763 |
| 10,506,735 B2* | 12/2019 | Turney | H01L 23/467 |
| 2002/0056544 A1* | 5/2002 | Azar | H01L 23/467 |
| | | | 257/722 |
| 2002/0118509 A1* | 8/2002 | Yamashita | H05K 7/20145 |
| | | | 361/679.33 |
| 2003/0188849 A1* | 10/2003 | Gawve | H01L 23/3672 |
| | | | 165/185 |
| 2004/0257778 A1* | 12/2004 | Lee | H05K 7/20409 |
| | | | 361/752 |
| 2005/0286226 A1* | 12/2005 | Ishii | H05K 7/20918 |
| | | | 257/E23.099 |
| 2007/0230184 A1* | 10/2007 | Shuy | F21V 29/83 |
| | | | 362/294 |
| 2010/0059213 A1* | 3/2010 | Liang | H05K 7/20409 |
| | | | 165/185 |
| 2010/0060130 A1* | 3/2010 | Li | F21V 29/773 |
| | | | 313/46 |
| 2010/0170657 A1* | 7/2010 | Kaslusky | H05K 7/20163 |
| | | | 165/80.3 |
| 2010/0242519 A1* | 9/2010 | Breidenassel | F21V 29/75 |
| | | | 165/185 |
| 2011/0094722 A1* | 4/2011 | Mori | H01L 23/473 |
| | | | 165/181 |
| 2012/0187830 A1* | 7/2012 | Shum | H05K 1/021 |
| | | | 315/32 |
| 2012/0218755 A1* | 8/2012 | Bakk | F21K 9/232 |
| | | | 362/249.02 |
| 2013/0216213 A1* | 8/2013 | Thomas | G05D 23/19 |
| | | | 165/104.34 |
| 2013/0294097 A1* | 11/2013 | Chen | F21V 29/74 |
| | | | 165/185 |
| 2015/0060023 A1* | 3/2015 | Herring | F28D 15/0266 |
| | | | 29/890.032 |
| 2015/0189791 A1* | 7/2015 | Tamura | H05K 7/20927 |
| | | | 29/890.035 |
| 2015/0233569 A1* | 8/2015 | Xue | F21V 29/777 |
| | | | 362/373 |
| 2015/0267909 A1* | 9/2015 | Suzuki | F21V 29/506 |
| | | | 362/294 |
| 2015/0373869 A1 | 12/2015 | Macerini et al. | |
| 2016/0152327 A1* | 6/2016 | Bertels | F04D 29/522 |
| | | | 415/121.3 |
| 2018/0288900 A1 | 10/2018 | Mahalingam et al. | |

* cited by examiner

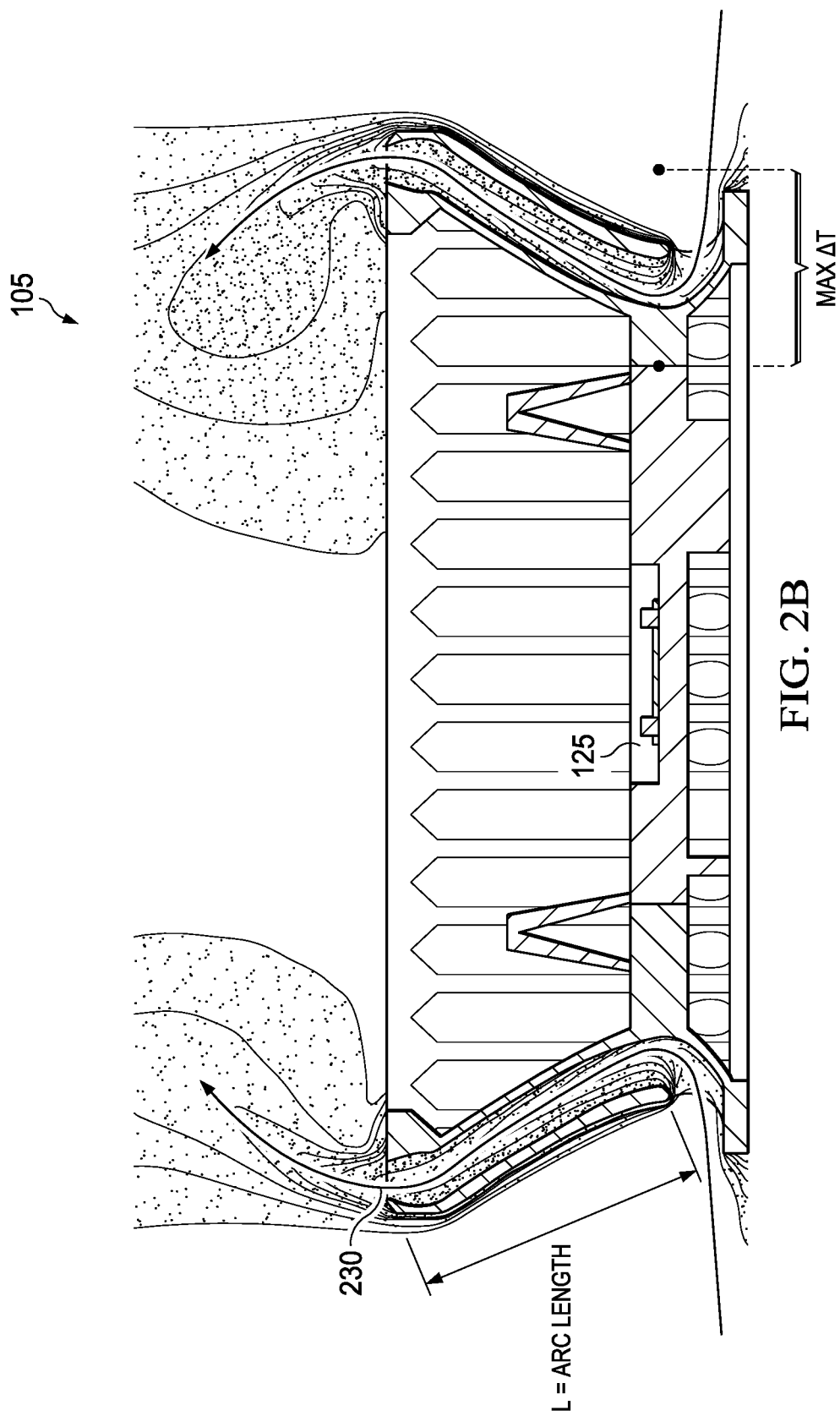

CHIMNEY COOLER DESIGN FOR RUGGED MAXIMUM FREE CONVECTION HEAT TRANSFER WITH MINIMUM FOOTPRINT

TECHNICAL FIELD

This disclosure is directed in general to heat transfer systems. More specifically, this disclosure is directed to a chimney cooler design for rugged maximum free convection heat transfer with a minimum footprint.

BACKGROUND

Electronic devices and other devices routinely generate heat (thermal energy) that needs to be removed from the devices in order to prevent overheating and damage to the devices. Typical heat transfer devices, such as radiating fins, are often susceptible to breaking, particularly in non-stationary environments. Moreover, radiating fins and other conventional heat transfer devices may sometimes require excessive amounts of space in order to achieve sufficient heat transfer away from the electronic devices and other devices.

SUMMARY

This disclosure provides a chimney cooler design for rugged maximum free convection heat transfer with a minimum footprint.

In a first embodiment, an apparatus includes a chimney cooler having a housing. The housing includes a base and sidewalls. The base is configured to support one or more heat-generating components. The sidewalls extend from the base, and each sidewall includes multiple channels. Each channel defines a serpentine flow path configured to receive a fluid coolant.

In a second embodiment, a system includes one or more heat-generating components and a chimney cooler having a housing. The housing includes a base and sidewalls. The base is configured to support the one or more heat-generating components. The sidewalls extend from the base, and each sidewall includes multiple channels. Each channel defines a serpentine flow path configured to receive a fluid coolant.

In a third embodiment, a method includes forming a base of a housing for a chimney cooler, where the base is configured to support one or more heat-generating components. The method also includes forming multiple channels into sidewalls of the housing extending from the base. Each channel defines a serpentine flow path configured to receive a fluid coolant.

In some embodiments, the sidewalls may be lofted away from the one or more heat-generating components as the sidewalls extend from the base. An inlet for each channel may be contoured to promote inertial flow of the fluid coolant into the serpentine flow path defined by the channel. An outlet for each channel may be contoured to promote inertial flow of the fluid coolant exiting the serpentine flow path defined by the channel. Channels at and adjacent to primary objective surfaces of the housing may share a common inlet. The channels at the primary objective surfaces of the housing may have larger outlets relative to the channels adjacent to the primary objective surfaces of the housing. The housing may include a monolithic structure.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIGS. 2A through 2C illustrate an example housing of a chimney cooler according to this disclosure;

DETAILED DESCRIPTION

FIGS. 1A through 4, described below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure.

Figure 1A:
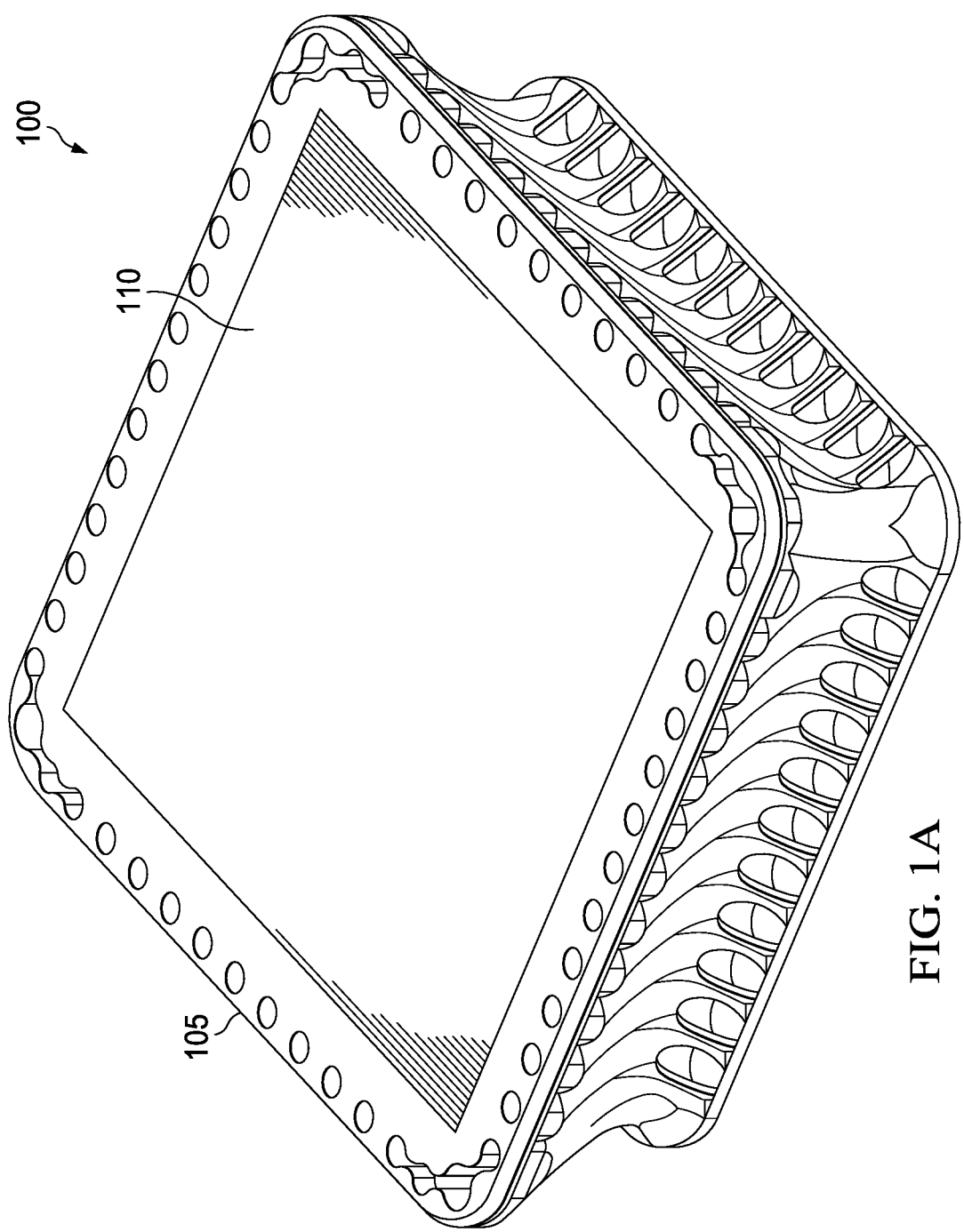
FIGS. 1A and 1B illustrate an example chimney cooler designed for rugged maximum free convection heat transfer with a minimum footprint according to this disclosure.
Figure 1B:
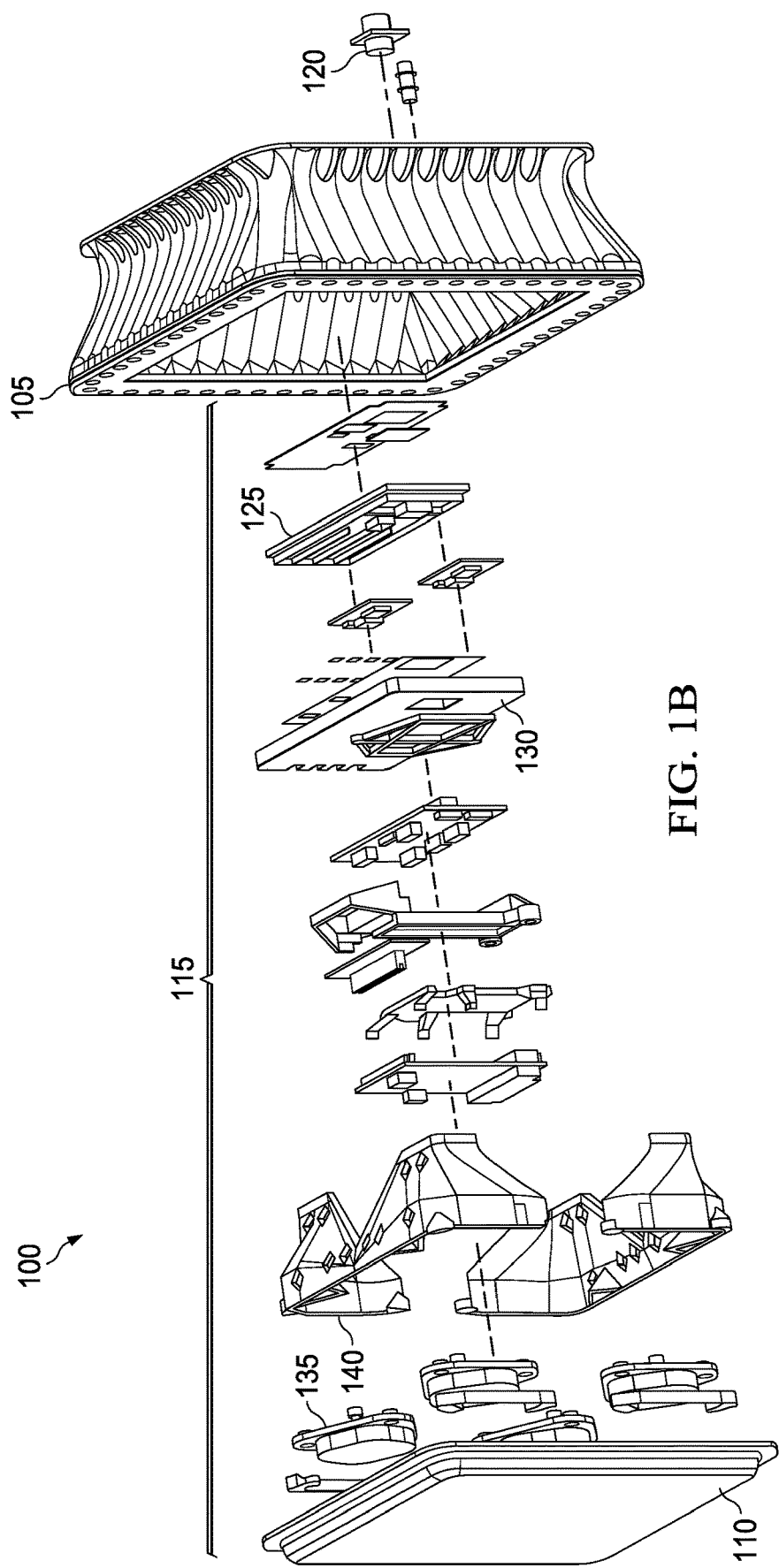

FIGS. 1A and 1B illustrate an example chimney cooler 100 designed for rugged maximum free convection heat transfer with a minimum footprint according to this disclosure. More specifically, FIG. 1A illustrates an example assembled view of the chimney cooler 100, and FIG. 1B illustrates an example exploded view of the chimney cooler 100. Note that the embodiment of the chimney cooler 100 illustrated in FIGS. 1A and 1B is for illustration only, and the sizes, numbers, and arrangements of components within the chimney cooler 100 can vary widely. Thus, FIGS. 1A and 1B do not limit the scope of this disclosure to any particular implementation of a chimney cooler.

As shown in FIGS. 1A and 1B, the chimney cooler 100 includes a housing 105 and a lid 110. The housing 105 and the lid 110 define an internal volume in which one or more internal components 115 may be positioned. The chimney cooler 100 is designed to increase free convection heat transfer for one or more electronics or one or more other thermal loads while reducing or minimizing the size and weight of the chimney cooler 100 and while increasing or maximizing durability of the chimney cooler 100. The design of the chimney cooler 100 provides an increased or maximal surface area for heat transfer and reduces or minimizes a heat conduction path from one or more heat-generating components to the housing 105 of the chimney cooler 100.

The housing 105 can entrain fluid coolant, such as cooler ambient air, into fluid channels of the housing 105 with reduced conductive distance(s) from one or more heat sources. The housing 105 can also be structured with a wavy or other non-planar outer surface to help increase surface area and structural durability. The housing 105 can have any suitable size, shape, and dimensions. In FIGS. 1A and 1B, the housing 105 generally has the form of a rectangular prism that is hollow inside and open on one side, although other forms for the housing 105 may be used. One example embodiment of the housing 105 is described in greater detail below in connection with FIGS. 2A through 2C. The lid 110 can be coupled to the housing 105 across the open side of the housing 105 in order to cover the interval volume inside the housing 105. The lid 110 may be coupled to the housing 105 in any suitable manner, such as via an adhesive, welding, bolting with an environmental gasket, thermal interface material, or diffusion bonding.

The housing 105 and the lid 110 may each be formed from any suitable material(s). For example, the housing 105 and the lid 110 may each be formed from at least one material having a high thermal conductivity, such as one or more metals. Also, the housing 105 and the lid 110 may be formed from one or more materials or have suitable dimensions to help resist damage due to impact. Further, the housing 105 and the lid 110 may each be formed in any suitable manner, such as additive manufacturing, injection molding, casting, or machining. The lid 110 here can be formed in a shape corresponding to the shape of the open side of the housing 105. The lid can be an RF transparent material, like Radome, and conform to a housing with a minimal footprint and electrical interference.

In this example, the one or more internal components 115 can perform one or more functions related to a system in which the chimney cooler 100 is used. For instance, the one or more internal components 115 may be used for communication purposes to send or receive wireless signals, and/or one or more internal components 115 may be used for further structural functions in the chimney cooler 100. The internal components 115 may include one or more connection components 120, which can be mounted to a base of the housing 105 and provide at least one passage for one or more wired connections to other internal components 115. The internal components 115 may include one or more heat-generating components 125, which can represent one or more electronic devices or other devices that can generate heat to be removed from the devices by the chimney cooler 100. The internal components 115 may include at least one cover 130 for the heat-generating components 125, one or more antennas 135, and/or one or more antenna stands 140. The internal components 115 may include one or more components for enhancing heat transfer from the heat-generating components 125 or other internal components 115 to inside surfaces of the housing 105 or lid 110.

Although FIGS. 1A and 1B illustrate one example of a chimney cooler 100 designed for rugged maximum free convection heat transfer with a minimum footprint, various changes may be made to FIGS. 1A and 1B. For example, a chimney cooler 100 may have any suitable number of internal components 115 in any suitable arrangement, and the internal components 115 inside the chimney cooler 100 may or may not be identical.

Figure 2A:
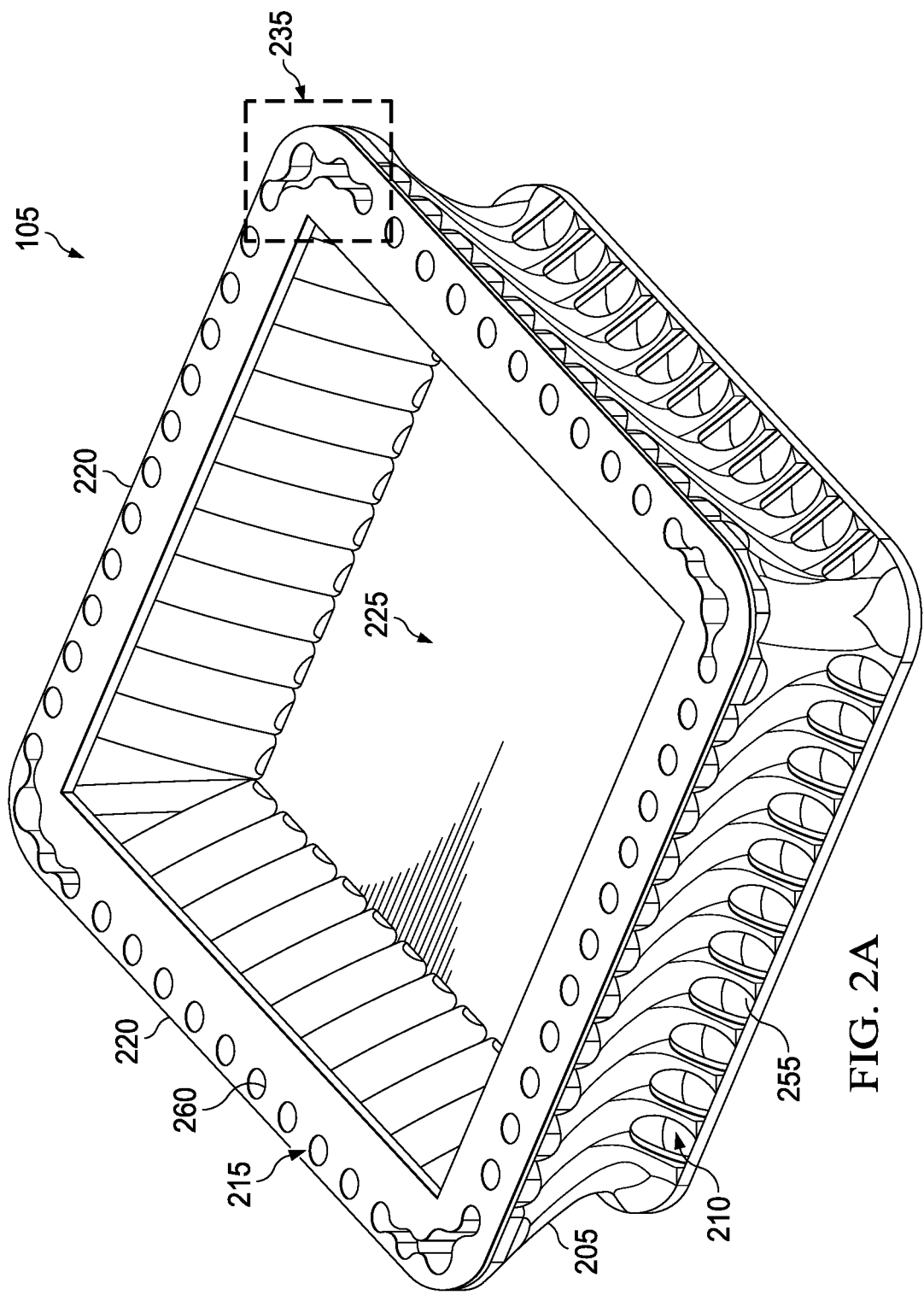
Figure 2C:
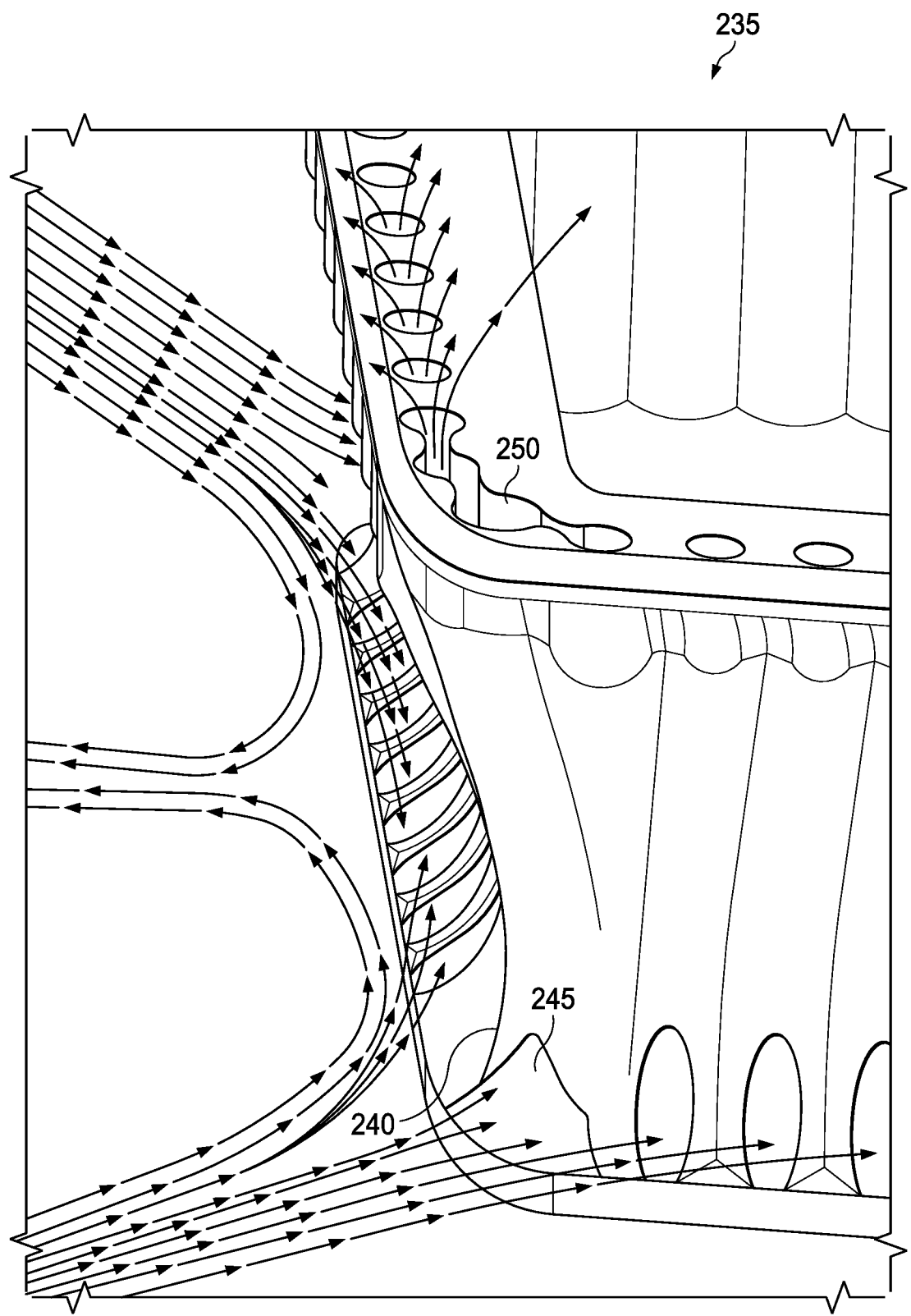

FIGS. 2A through 2C illustrate an example housing 105 of a chimney cooler 100 according to this disclosure. More specifically, FIG. 2A illustrates a perspective view of the housing 105, FIG. 2B illustrates a cross-sectional view of the housing 105, and FIG. 2C illustrates an enlarged view of a corner of the housing 105. Note that the embodiment of the housing 105 illustrated in FIGS. 2A through 2C is for illustration only, and FIGS. 2A through 2C do not limit the scope of this disclosure to any particular implementation of a housing for a chimney cooler.

As shown in FIGS. 2A through 2C, the housing 105 includes a plurality of channels 205, where each channel 205 includes an inlet 210 and an outlet 215. The channels 205 here are formed in sidewalls 220 of the housing 105, where the sidewalls 220 extend away from a base 225 of the housing 105. Among other things, the housing 105 is designed to increase heat transfer away from the one or more heat-generating components 125 and increase the rigidity and durability of the chimney cooler 100, which helps to protect the one or more heat-generating components 125 from damaged. The housing 105 can be designed with a low profile in order to not excessively encumber a system in which the housing 105 is mounted. In some embodiments, the housing 105 can be formed as a monolithic structure.

The sidewalls 220 and base 225 can be formed using at least one material having high thermal conductivity, such as one or more metals (e.g. carbon, metal-filled polymer, etc.). This may allow the sidewalls 220 and base 225 to help remove thermal energy from the one or more heat-generating components 125. Note, however, that the base 225 may optionally include a thermal insulation layer on an exterior of the base 225, which may help force thermal energy absorbed by the base 225 to transfer to the sidewalls 220 for removal. This can help to thermally protect any system to which the housing 105 is mounted. Various fabrication techniques may be used to form the housing 105, such as additive manufacturing or other techniques described above.

In this example, the sidewalls 220 of the housing 105 expand away from the internal volume of the housing 105 as the sidewalls 220 move away from the base 225. This helps to increase the overall surface area of the sidewalls 220. Because of this, a cross-section of the housing 105 at the bottoms of the sidewalls 220 by the inlets 210 is smaller than a cross-section of the housing 105 at the tops of the sidewalls 220 by the outlets 215. This orientation of the sidewalls 220 provides flow paths for the ambient air or other fluid coolant that are directed away from the center of the housing 105.

In some embodiments, heat transfer from the housing 105 to the ambient environment can occur through natural convection. Here, the housing 105 may provide multiple mechanisms of heat transfer, including convection to the ambient air outside of the housing 105 and convection to the air/fluid passing through the channels 205. The strength of natural convection is defined in principle as the ratio of buoyant force to viscous force, which is shown to be proportional to the temperature difference between a heated surface and an ambient fluid. In particular embodiments, the natural convection can be expressed as follows:

$$Gr = \frac{\text{Bouyant Force} \times \text{Inertial Force}}{(\text{Viscous Force})^2} \quad (1)$$

$$Gr = \frac{g * \beta * (T_w - T_e) * L^3}{\nu^2} = \rho L^3 g \beta (T_w - T_e) \times \frac{\rho V^2 L^2}{(\mu V L)^2} \quad (2)$$

Here, Gr represents the Grashof number, which approximates the ratio of buoyancy-to-viscous forces acting on a fluid. Also, g represents gravitational acceleration, and β represents a coefficient of volume expansion. Further, $T_w$ represents a temperature of the channels 205, and $T_e$ represents a temperature outside a thermal boundary layer or ambient temperature. In addition, L represents a length of an arc, ν represents a kinematic viscosity of the fluid, ρ represents a density of the fluid, and μ represents the flow velocity. This concept can be used to maximize a development of natural convective currents by entraining cooler ambient temperatures near hotter surfaces of the housing 105 in order to optimize temperature differences and density gradients in the fluid. As described below, incorporating serpentine arc sections into the paths of the channels 205 further achieves additional convective path lengths that drive enhancements to buoyant forces $\propto L^3$. Additional arc flow path lengths also increase overall convective surface areas for heat transfer. External and internal surfaces of the housing 105 have additional surface augmentations to increase surface area and produce resilient impact strengths capable of distributing loads (in contrast to traditional fins that are prone to local strain and breakage).

As noted above, each channel 205 includes an inlet 210 and an outlet 215. Each inlet 210 can be formed at the base of the associated channel 205, such as at the bottom of the associated sidewall 220, and each inlet 210 is open to an outside of the housing 105. The shape of each inlet 210 can improve or enhance the flow of fluid coolant (such as ambient air) into a serpentine flow path 230 defined by the channel 205. Various inlets 210 can also include or be associated with one or more design parameters relating to promoting coolant flow into regions where heat transfer is most advantageous, such as one or more primary objective surfaces 235 of the housing 105. Examples of design parameters of the inlets 210 can include features such as their orientations, contours, or shapes. Inlets 210 and outlets 215 of the channels 205 are contoured to promote inertial flow. The contour 255 of each inlet 210 can promote inertial flow into the serpentine flow path 230 of the associated channel 205. This can also enhance the chimney effect of the channel 205 drawing air through the channel 205 when the ambient air is not significantly moving. The serpentine flow paths 230 can be structured in any shape, including a helical, spiral, etc. The serpentine flow paths 230 are also structured to camber inward toward a source of the heat near a base of the housing. The contour 260 of each outlet 215 can promote inertial flow exiting the serpentine flow path 230 of the associated channel 205. Lines of contouring can minimize entrance and discharge losses to promote inertial flow. This can also control a direction of the flow leaving the channel 205 away from the center of the housing 105. In some cases, the contour 260 can aid in directing more air flow to one or more primary objective surfaces 235 of the housing 105 where the greatest amount of heat can be transferred.

When air speeds directed at the housing 105 are less than some threshold value (such as 2 miles per hour), air can flow naturally through the serpentine flow paths 230 based on a chimney effect, which provides an additional cooling function (in addition to convection from the other surfaces of the housing 105). As the air speed increases, the heat transfer by the housing 105 can increasingly be dominated by forced convective airflow, which can provide enhanced heat transfer on the exterior of the housing 105. For instance, an air flow of 10 miles per hour directed at the housing 105 may bend around the housing 105 more than flow through the serpentine flow paths 230. As more air crosses the housing 105, the heat transfer between the housing 105 and the forced convective airflow also increases.

In this particular example, the design of the housing 105 includes larger open primary objective channels 240 at the primary objective surfaces 235 of the housing 105. As shown in FIG. 2C, multiple primary objective channels 240 can share a single primary objective inlet 245, while each of the primary objective channels 240 has a separate corner outlet 250. The expansion of the serpentine flow paths 230 in the primary objective channels 240 increases the bias of the air flow to the primary objective surfaces 235, where maximum heat transfer can be utilized. The primary objective outlets 250 at each primary objective surface 235 can also be expanded so that they connect to one another, thereby collectively forming one large outlet as shown in FIG. 2C. The primary objective inlets 245 and the primary objective outlets 250 can have design features similar to the inlets 210 and outlets 215.

While the primary objective surfaces 235 are illustrated as corners of the housing 105, the primary object surfaces 235 can be located at any point of the housing 105, for any shape of the housing 105. For example, the flow channel openings may be increase to bias flow to a distinct region for improved localized heat transfer. For circular or oval geometry housings 105, the primary objective channels 240 and primary objective inlets 245 could be axis-symmetric. However, the primary objective channels 240 and primary objective inlets 245 could also be not symmetric if internal source was non symmetric or in an application with forced convection or directional movement of assembly or system on a vehicle is relevant.

Curved vs rectangular ducting is driven more so by structural integrity. Rectangular ducting will provide a more rigid structure capable of absorbing more impact force for ruggedization. For example, the curved sections near the outlet in FIG. 1B were cut flat where a cross section would look like a 'D' shape to distribute impact force over more area.

Although FIGS. 2A through 2C illustrate one example of a housing 105 for a chimney cooler 100, various changes may be made to FIGS. 2A through 2C. For example, a housing 105 may have any suitable number of channels 205 in any suitable arrangement, and the serpentine flow paths 230 defined by the channels 205 may or may not be identical.

Figure 3A:
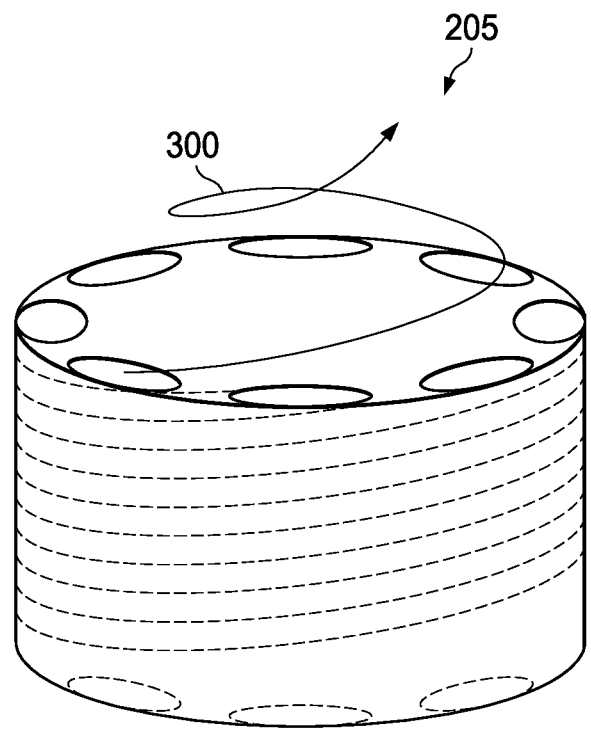
FIGS. 3A through 3C illustrate example effects of vorticity for a serpentine flow path in a chimney cooler according to this disclosure.
Figure 3B:
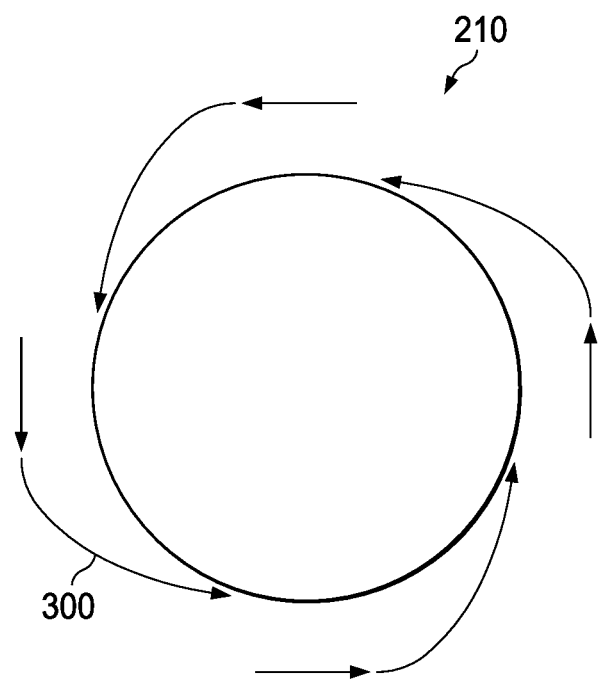
Figure 3C:
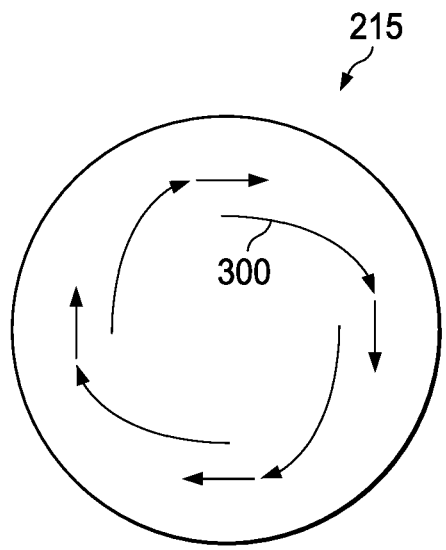

FIGS. 3A through 3C illustrate example effects of vorticity 300 for a serpentine flow path 230 in a chimney cooler 100 according to this disclosure. More specifically, FIG. 3A illustrates an example vorticity 300 through a channel 205, FIG. 3B illustrates an example effect of the vorticity 300 at the inlet 210 of the channel 205, and FIG. 3C illustrates an example effect of the vorticity 300 at the outlet 215 of the channel 205. Note that the embodiment of the vorticity 300 illustrated in FIGS. 3A through 3C is for illustration only. FIGS. 3A through 3C do not limit the scope of this disclosure to any particular implementation of a channel in a housing.

As shown in FIGS. 3A through 3C, the vorticity 300 can be controlled or modified by one or more of the inlet 210, the outlet 215, and the channel 205. For example, the inlet 210 can be structured to cause the ambient air around the housing 105 to be pulled into the channel 205. The vorticity 300 can be designed in either a clockwise direction or a counterclockwise direction, and the vorticity 300 can be designed differently for each of the channels 205. For instance, adjacent channels 205 can have increasing or decreasing vorticity 300 in comparison. While FIGS. 3A through 3C illustrate a counterclockwise air flow through the channel 205, the air flow may also be clockwise.

Although FIGS. 3A through 3C illustrate one example of the effects of vorticity 300 for a serpentine flow path 230 in a chimney cooler 100, various changes may be made to FIGS. 3A through 3C. For example, the direction of rotation may be reversed or randomized. Also, the relative sizes, shapes, and dimensions of the components of the housing 105 may vary as needed or desired.

Figure 4:
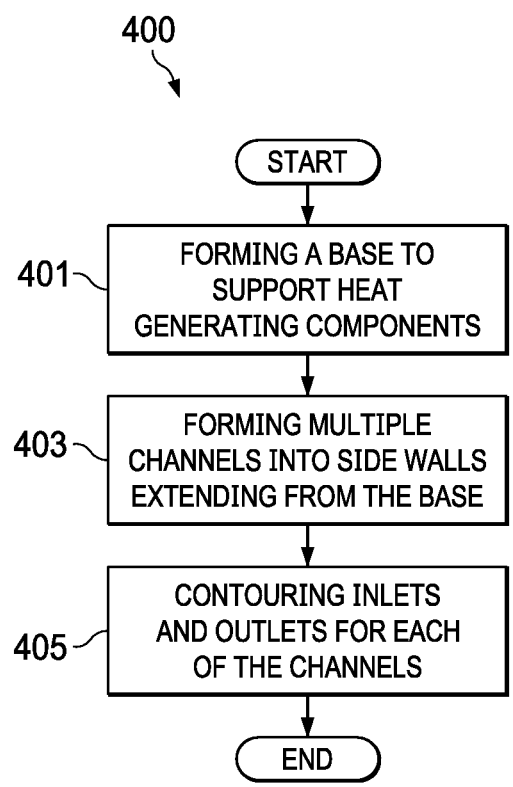
FIG. 4 illustrates an example method for producing a chimney cooler designed for rugged maximum free convection heat transfer with a minimum footprint according to this disclosure.

FIG. 4 illustrates an example method 400 for producing a chimney cooler designed for rugged maximum free convection heat transfer with a minimum footprint according to this disclosure. For ease of explanation, the method 400 is described as being performed to produce the chimney cooler 100 of FIGS. 1A and 1B, which includes the housing 105 of FIGS. 2A through 2C. However, the method 400 can be used to produce any other suitable chimney coolers.

As shown in FIG. 4, a base 225 of the housing 105 is formed to support one or more heat-generating components 125 at step 401, and multiple channels 205 are formed into sidewalls 220 extending from the base 225 at step 403. The housing 105 can be formed as a monolithic structure (a structure made of a single piece of material). The housing 105 can also be formed using at least one material with a high thermal conductivity for efficient heat removal from the one or more heat-generating components 125 that will be operating inside the housing 105. Each channel 205 defines a serpentine flow path 230. The sidewalls 220 can be formed to have a wavy exterior, which allows a greater amount of surface area to be exposed to the ambient air.

Inlets 210 and outlets 215 of the channels 205 are contoured to promote inertial flow at step 405. The contouring of each inlet 210 can promote inertial flow into the serpentine flow path 230 of the associated channel 205. This can also enhance the chimney effect of the channel 205 drawing air through the channel 205 when the ambient air is not significantly moving. The contouring of each outlet 215 can promote inertial flow exiting the serpentine flow path 230 of the associated channel 205. This can also control a direction of the flow leaving the channel 205 away from the center of the housing 105. In some cases, the contouring can aid in directing more air flow to one or more primary objective surfaces 235 of the housing 105 where the greatest amount of heat can be transferred. At each primary objective surface 235 of the housing 105, multiple primary objective channels 240 can share a single primary objective inlet 245, and the primary objective channels 240 can have larger primary objective outlets 250 (compared to the outlets 215 of the channels 205 that are located adjacent to but not at the primary objective surfaces 235). These design features can encourage flow of ambient air to the primary objective surfaces 235, which again may represent the areas of highest heat transfer of the housing 105.

Although FIG. 4 illustrates one example of a method 400 for producing a chimney cooler designed for rugged maximum free convection heat transfer with a minimum footprint, various changes may be made to FIG. 4. For example, while shown as a series of steps, various steps shown in FIG. 4 may overlap, occur in parallel, occur in a different order, or occur multiple times.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a chimney cooler comprising a housing, wherein the housing comprises:
      a base with a surface configured to support one or more heat-generating components; and
      sidewalls extending from a perimeter of the surface of the base configured to support the one or more heat-generating components and lofted away from a center of the base in a direction along a plane of the surface of the base as the sidewalls extend from the base, each sidewall including multiple channels, wherein each channel defines a serpentine flow path that extends through an interior of an associated one of the sidewalls from an inlet formed on a first surface of the associated sidewall adjacent to the base to an outlet formed on a second surface of the associated sidewall opposite the base, and wherein each channel is configured to receive a fluid coolant in the direction along the plane of the surface of the base and output the fluid coolant in a direction away from a plane perpendicular to the base at the center of the base.

2. The apparatus of claim 1, wherein the inlet for each channel is contoured to promote inertial flow of the fluid coolant into the serpentine flow path defined by the channel.

3. The apparatus of claim 1, wherein the outlet for each channel is contoured to promote inertial flow of the fluid coolant exiting the serpentine flow path defined by the channel.

4. The apparatus of claim 1, wherein channels at and adjacent to primary objective surfaces of the housing share a common inlet.

5. The apparatus of claim 4, wherein the channels at the primary objective surfaces of the housing have larger outlets relative to the channels adjacent to the primary objective surfaces of the housing.

6. The apparatus of claim 1, wherein the housing comprises a monolithic structure.

7. A system comprising:
one or more heat-generating components; and
a chimney cooler comprising a housing, wherein the housing comprises:
   a base with a surface configured to support the one or more heat-generating components; and
   sidewalls extending from a perimeter of the surface of the base configured to support the one or more heat-generating components and lofted away from a center of the base in a direction along a plane of the surface of the base as the sidewalls extend from the base, each sidewall including multiple channels, wherein each channel defines a serpentine flow path that extends through an interior of an associated one of the sidewalls from an inlet formed on a first surface of the associated sidewall adjacent to the base to an outlet formed on a second surface of the associated sidewall opposite the base, and wherein each channel is configured to receive a fluid coolant in the direction along the plane of the surface of the base and output the fluid coolant in a direction away from a plane perpendicular to the base at the center of the base;
wherein the inlet for each channel is contoured to promote inertial flow of the fluid coolant into the serpentine flow path defined by the channel.

8. The system of claim 7, wherein the sidewalls are lofted away from the one or more heat-generating components as the sidewalls extend from the base.

9. The system of claim 7, wherein the outlet for each channel is contoured to promote inertial flow of the fluid coolant exiting the serpentine flow path defined by the channel.

10. The system of claim 7, wherein channels at and adjacent to primary objective surfaces of the housing share a common inlet.

11. The system of claim 10, wherein the channels at the primary objective surfaces of the housing have larger outlets relative to the channels adjacent to the primary objective surfaces of the housing.

12. The system of claim 7, wherein the housing comprises a monolithic structure.

13. A method comprising:
forming a base of a housing for a chimney cooler, the base having a surface configured to support one or more heat-generating components; and
forming multiple channels in sidewalls of the housing extending from a perimeter of the surface of the base configured to support the one or more heat-generating components and lofted away from a center of the base in a direction along a plane of the surface of the base as the sidewalls extend from the base, each channel defining a serpentine flow path that extends through an interior of an associated one of the sidewalls from an inlet formed on a first surface of the associated sidewall adjacent to the base to an outlet formed on a second surface of the associated sidewall opposite the base, and wherein each channel is configured to receive a fluid coolant in the direction along the plane of the surface of the base and output the fluid coolant in a direction away from a plane perpendicular to the base at the center of the base; and
contouring the outlet for each channel to promote inertial flow of the fluid coolant exiting the serpentine flow path defined by the channel.

14. The method of claim 13, wherein the sidewalls are lofted away from the one or more heat-generating components as the sidewalls extend from the base.

15. The method of claim 13, further comprising:
contouring the inlet for each channel to promote inertial flow of the fluid coolant into the serpentine flow path defined by the channel.

16. The method of claim 13, wherein:
channels at and adjacent to primary objective surfaces of the housing share a common inlet; and
the channels at the primary objective surfaces of the housing have larger outlets relative to the channels adjacent to the primary objective surfaces of the housing.

17. The method of claim 13, wherein the housing comprises a monolithic structure.

18. An apparatus comprising:
a chimney cooler comprising a housing, wherein the housing comprises:
   a base with a surface configured to support one or more heat-generating components; and
   sidewalls extending from a perimeter of the surface of the base configured to support the one or more heat-generating components and lofted away from a center of the base in a direction along a plane of the surface of the base as the sidewalls extend from the base, each sidewall including multiple channels, wherein each channel defines a serpentine flow path that extends through an interior of an associated one of the sidewalls from an inlet formed on a first surface of the associated sidewall adjacent to the base to an outlet formed on a second surface of the associated sidewall opposite the base, and wherein each channel is configured to receive a fluid coolant in the direction along the plane of the surface of the base and output the fluid coolant in a direction away from a plane perpendicular to the base at the center of the base;
wherein the outlet for each channel is contoured to promote inertial flow of the fluid coolant exiting the serpentine flow path defined by the channel.

19. The apparatus of claim 18, wherein the housing comprises a monolithic structure.

20. The apparatus of claim 18, wherein the inlet for each channel is contoured to promote inertial flow of the fluid coolant into the serpentine flow path defined by the channel.

* * * * *